US008729646B2

(12) United States Patent
Chu et al.

(10) Patent No.: US 8,729,646 B2
(45) Date of Patent: May 20, 2014

(54) MEMS DEVICES AND METHODS FOR FORMING THE SAME

(75) Inventors: Chia-Hua Chu, Zhubei (TW);
Chun-Wen Cheng, Zhubei (TW);
Te-Hao Lee, Taipei (TW); Chung-Hsien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/571,258

(22) Filed: Aug. 9, 2012

(65) Prior Publication Data

US 2014/0042562 A1    Feb. 13, 2014

(51) Int. Cl.
*H01L 29/84*    (2006.01)

(52) U.S. Cl.
USPC .......................................... 257/415; 257/416

(58) Field of Classification Search
CPC .............. H01L 41/0973; H01L 41/332; B81C 1/00158; B81B 2201/0257
USPC ................................................ 257/415, 416
See application file for complete search history.

(56) References Cited

U.S. PATENT DOCUMENTS

2009/0273043 A1*  11/2009  Lee et al. ...................... 257/416
2013/0043510 A1    2/2013   Shu et al.

OTHER PUBLICATIONS

"MEMS Motion Tracking Devices fo Smartphones and Tablets," InvenSense, http://www.invensense.com/mems/smartphones-and-tabelts.html, 1 page, copyright 2013, printed Oct. 9, 2013.

* cited by examiner

*Primary Examiner* — Tran Tran
(74) *Attorney, Agent, or Firm* — Slater and Matsil, L.L.P.

(57) ABSTRACT

A device includes a Micro-Electro-Mechanical System (MEMS) wafer having a MEMS device therein. The MEMS device includes a movable element, and first openings in the MEMS wafer. The movable element is disposed in the first openings. A carrier wafer is bonded to the MEMS wafer. The carrier wafer includes a second opening connected to the first openings, wherein the second opening includes an entry portion extending from a surface of the carrier wafer into the carrier wafer, and an inner portion wider than the entry portion, wherein the inner portion is deeper in the carrier wafer than the entry portion.

20 Claims, 31 Drawing Sheets

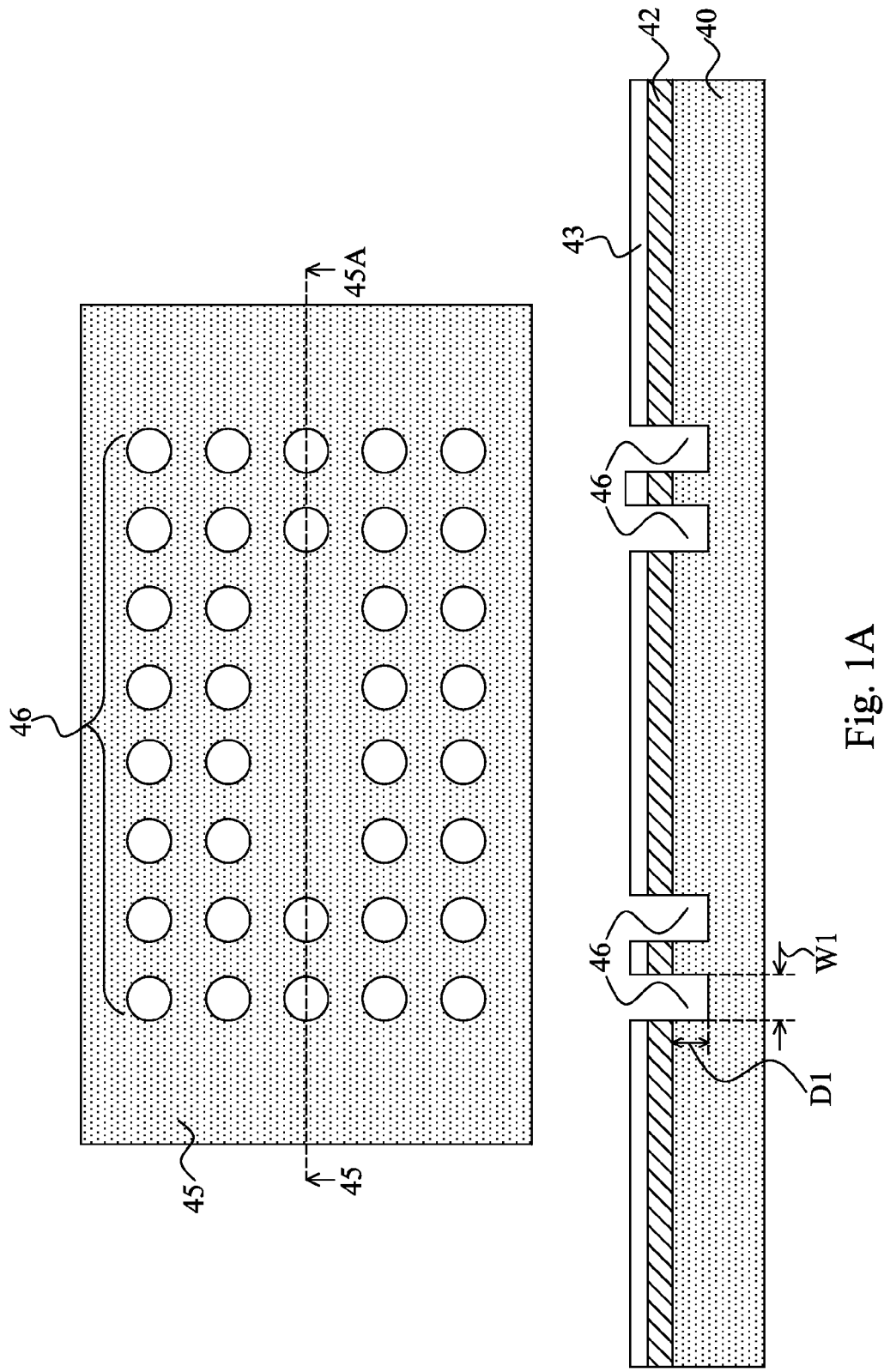

MEMS DEVICES AND METHODS FOR FORMING THE SAME

BACKGROUND

Micro-Electro-Mechanical System (MEMS) devices may be used in various applications such as micro-phones, accelerometers, inkjet printers, etc. A commonly used type of MEMS devices includes a MEMS capacitor that has a movable element (sometimes referred to as a proof mass) as a capacitor plate, and a fixed element as the other capacitor plate. The movement of the movable element causes the change in the capacitance of the capacitor. The change in the capacitance may be converted into the change in an electrical signal, and hence the MEMS device may be used as a microphone, an accelerometer, or the like.

The movable elements of MEMS devices may move in air cavities when the MEMS devices are operated. The resistance of the air (and/or out-gassed gases from the respective chip) in the air cavities to then movable elements is preferably small. The resistance is related to the pressure in the air cavities. To reduce the resistance, the pressure in the air cavities should be small. The reduction of the air pressure may be achieved by increasing the volume of the cavities. This approach, however, encounters process difficulties.

The air cavities may be formed in a MEMS wafer, in which the MEMS devices are located. When the cavities are enlarged, the bonding area that can be used for the MEMS wafer to be bonded to another wafer (such as a cap wafer), however, is reduced since the bond is formed on the portions of the MEMS wafer where no cavity is formed. The reduction in the bonding area may cause the reliability of the bond to be sacrificed.

The air cavities may also be formed in a cap wafer that is used to protect the MEMS wafer. The cap wafer, however, needs to have some portions removed, so that the bond pads in the MEMS wafer may be exposed in order to perform wire bonding on the bond pads. The removal of these portions of the cap wafer and the formation of the cavities in the cap wafer require separate lithography masks, and the manufacturing cost is high.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 1I are cross-sectional views and top views of intermediate stages in the manufacturing of a package including a Micro-Electro-Mechanical System (MEMS) device in accordance with some exemplary embodiments, wherein air cavities are formed in a MEMS wafer through an anisotropic etching followed by an isotropic etching;

DETAILED DESCRIPTION OF ILLUSTRATIVE EMBODIMENTS

Figure 1B:
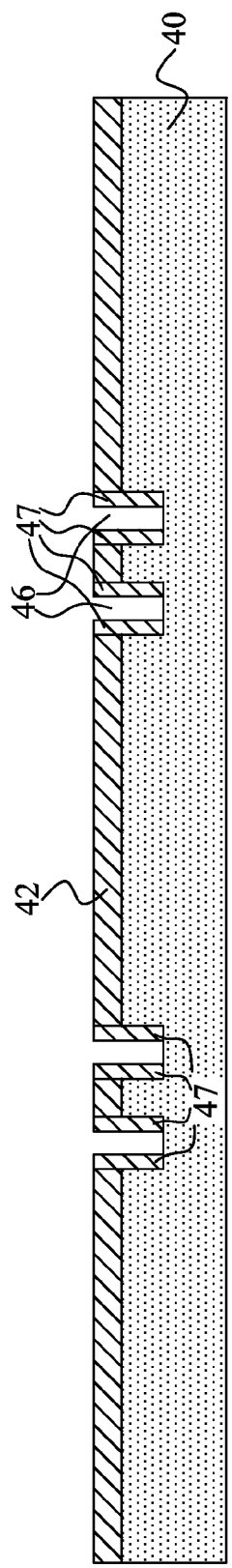

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Micro-Electro-Mechanical System (MEMS) devices and the methods of forming the same are provided in accordance with various embodiments. The intermediate stages of forming the MEMS devices are illustrated. The variations of the embodiments are discussed. Throughout the various views and illustrative embodiments, like reference numbers are used to designate like elements. Throughout the description, the term "opening" and "cavity" may be used interchangeably. Furthermore, throughout the description, wafers 40 and 60 (FIGS. 1I, 2I and 4G, for example) and wafer 78 (FIG. 3F, for example), which are bonded to MEMS wafers in various embodiments, are collectively referred to as carrier wafers.

FIGS. 1A through 1I are cross-sectional views of intermediate stages in the manufacturing of a package including a MEMS device in accordance with some exemplary embodiments. Wafer 40 is provided. Wafer 40 may be a silicon wafer, for example. Wafer 40 is free from active devices such as transistors therein, and may be, or may not be, free from passive devices such as resistors, capacitors, and inductors therein. Oxide layer 42 is formed, for example, through a deposition step using Plasma Enhance Chemical Vapor Deposition (PECVD) or the oxidation of wafer 40. Oxide layer 42 and wafer 40 are then patterned using an anisotropic etching method to form openings 46 in wafer 40 and oxide layer 42. In some embodiments, openings 46 have width W1 between about 1 µm and about 25 µm, for example. Depth D1 of openings 46 may be between about 5 µm and about 50 µm, for example. It is appreciated, however, that the values recited throughout the description are merely examples, and may be changed to different values. Openings 46 are adjacent to each other, and may be laid out in various patterns including and not limited to, arrays, beehives, or the like.

In FIG. 1A, a top view and a cross-sectional view of mask layer 43, which is formed on oxide layer 42, is also shown. The top view and the cross-sectional view are at the top and bottom, respectively, of FIG. 1A, wherein the cross-sectional view is obtained from the plane crossing line 45A-45A in the top view. Mask layer 43 is used as an etching mask to pattern oxide layer 42 and etch openings 46 into surfaces of wafer 40. In some embodiments, mask layer 43 formed of a material (such as a nitride) different from the material of oxide layer 42, and may be formed by deposition using PECVD, for example. A photoresist coating, a lithography patterning, and an etch step may then be performed to leave the remaining mask layer as mask layer 43. In alternative embodiments, mask layer 43 is formed of a photo resist, which is then patterned to leave the remaining portion as mask layer 43. Mask layer 43 may be removed after the patterning of oxide layer 42.

FIG. 1B illustrates how the sidewall protection layers 47 are formed. After the etching of openings 46, an oxide layer is formed to cover the surface of the wafer 40, along with sidewalls and bottoms of openings 46. The oxide layer can be formed by PECVD or oxidation of the wafer 40. After the oxide layer is formed, an etch-back step is performed to remove the oxide layer at the bottoms of the openings 46, therefore leaving the sidewalls protection layer 47 remained.

Figure 1C:
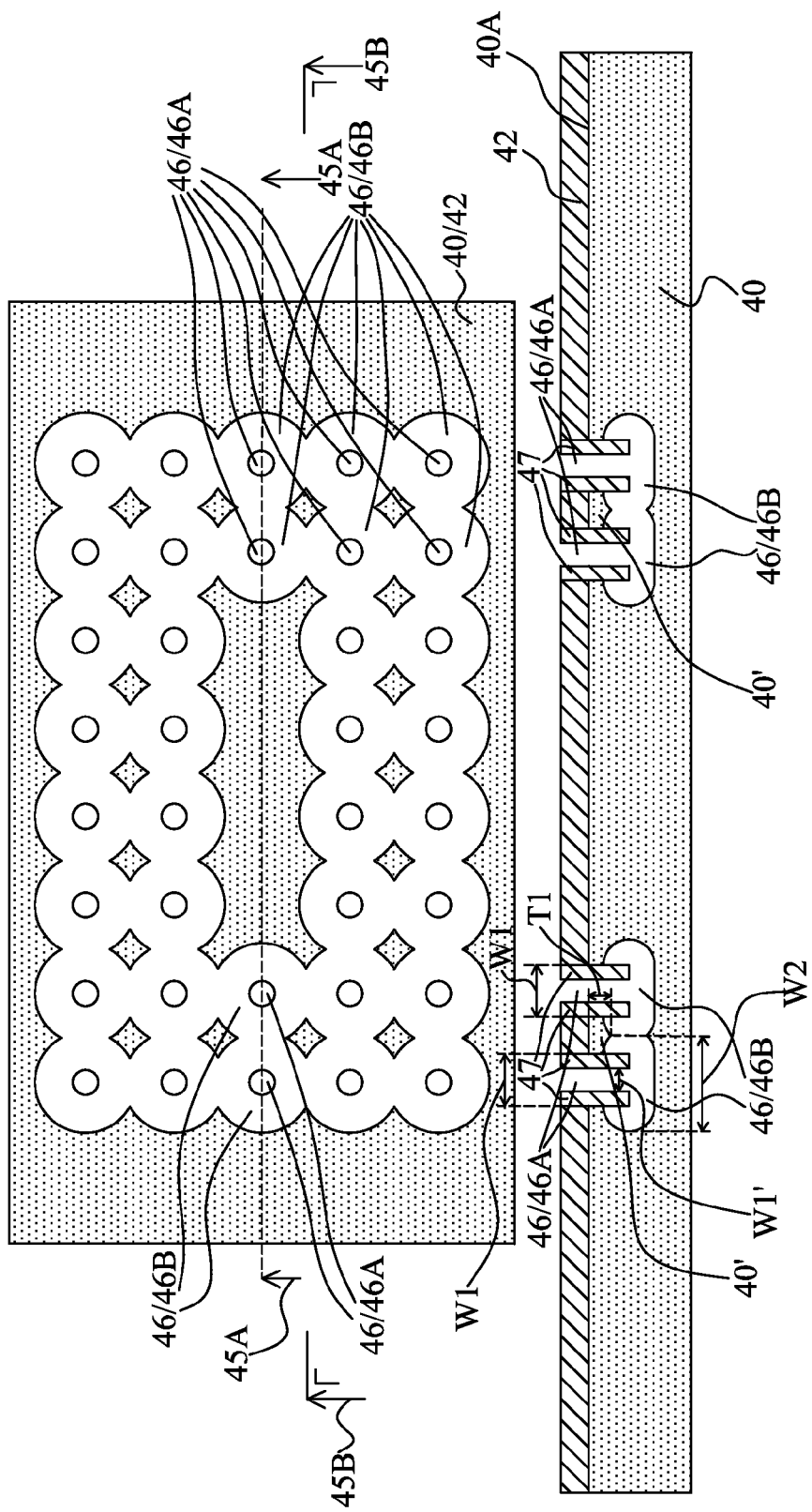

FIG. 1C illustrates an isotropic etching of wafer 40. During the isotropic etching, sidewall protection layers 47 protect the sidewalls of openings 46 within wafer 40. The portions of wafer 40 at the bottoms of openings 46 are not protected, and hence are etched. Due to the isotropic etching, bottoms of openings 46 expand horizontally and vertically, and hence the profile as shown in FIG. 1C is formed. The resulting openings 46 comprise entry portions 46A, which have smaller widths such as W1', and inner portions 46B, which have widths W2 greater than widths W1' and W1. Due to the anisotropic etching (FIG. 1A), the sidewalls of entry portions 46A are substantially vertical, and are substantially perpendicular to top surface 40A of wafer 40. Due to the isotropic etching, the sidewalls of inner portions 46B are curved. Neighboring openings 46 may be interconnected to form greater openings. Residue portions 40' of wafer 40 are left un-etched, and are interconnected to each other. Accordingly, although FIG. 1C shows that residue portions 40' are not connected, they are actually interconnected in the plane crossing line 45B-45B. Thickness T1 of residue portions 40' may be greater than about 5 μm, so that residue portions 40' have adequate mechanical strength, and hence do not break apart.

Due to the anisotropic etching and the isotropic etching, openings 46 have bottom width W2 greater than top width W1. Accordingly, the volume of openings 46 are increased without the need of increasing top width W1. The area of wafer 40 that can be used for wafer bonding, for example, to MEMS wafer 48 (FIG. 1D), is thus not adversely reduced by the increase in the volume of openings 46.

Figure 1D:
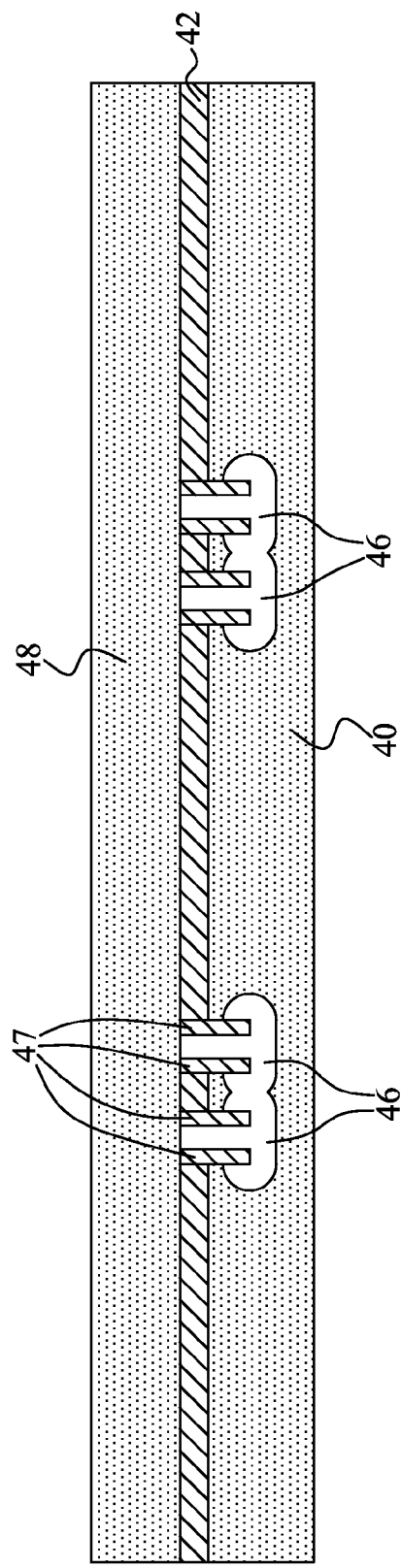

Referring to FIG. 1D, wafer 40 is bonded to MEMS wafer 48, which is formed of a conductive material. Wafer 48 may be a silicon wafer, and may be doped with a p-type or an n-type impurity to increase the conductivity. Furthermore, wafer 48 may be a blanket wafer with no CMOS devices formed therein. The bonding may be a fusion bonding. After the bonding, MEMS wafer 48 is thinned to a desirable thickness.

Figure 1E:
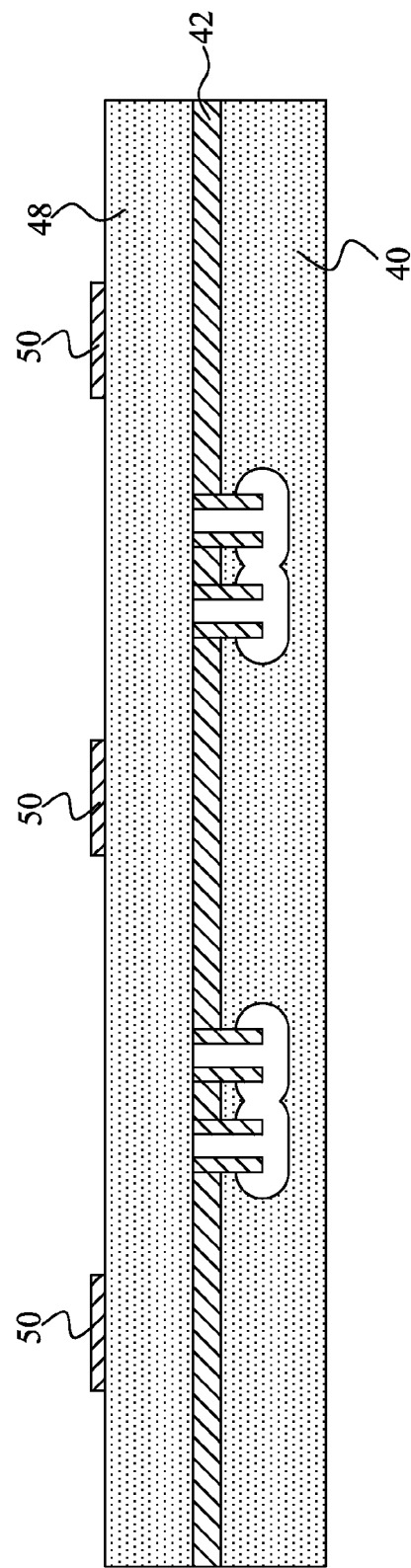

Referring to FIG. 1E, bond layers 50 are formed, which may be formed, for example, using Physical Vapor Deposition (PVD) and a lithography step. Bond layers 50 may form one or more ring in the top view of wafer 48. In some embodiments, bond layers 50 are aluminum layers, germanium layers, indium layers, gold layers, or tin layers. The material of bond layer 50 is capable of forming a eutectic alloy with the material of bond layers 70 (FIG. 1H). Accordingly, the material of bond layers 50 and the material of bond layers 70 are selected correspondingly.

Figure 1F:
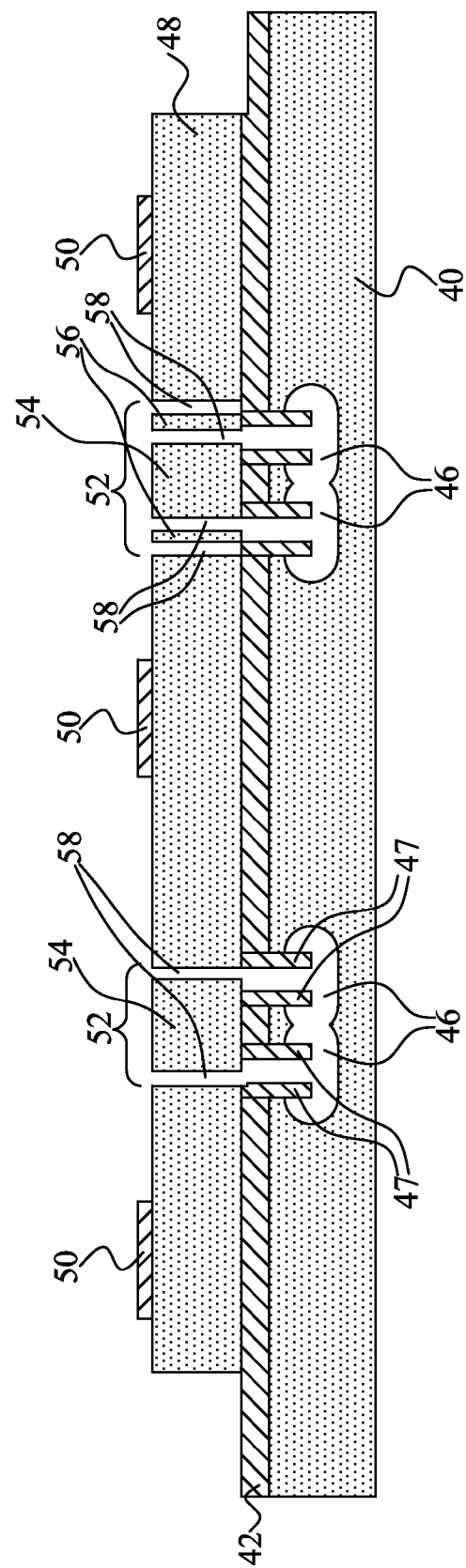

As shown in FIG. 1F, MEMS wafer 48 is patterned to form MEMS devices 52. In some embodiments, MEMS devices 52 include movable elements 54 (which are also sometimes referred to as proof masses), and springs 56 for supporting movable elements 54. The patterning of MEMS wafer 48 results in the formation of openings 58 in MEMS wafer 48, wherein openings 58 are connected to openings 46.

Figure 1G:
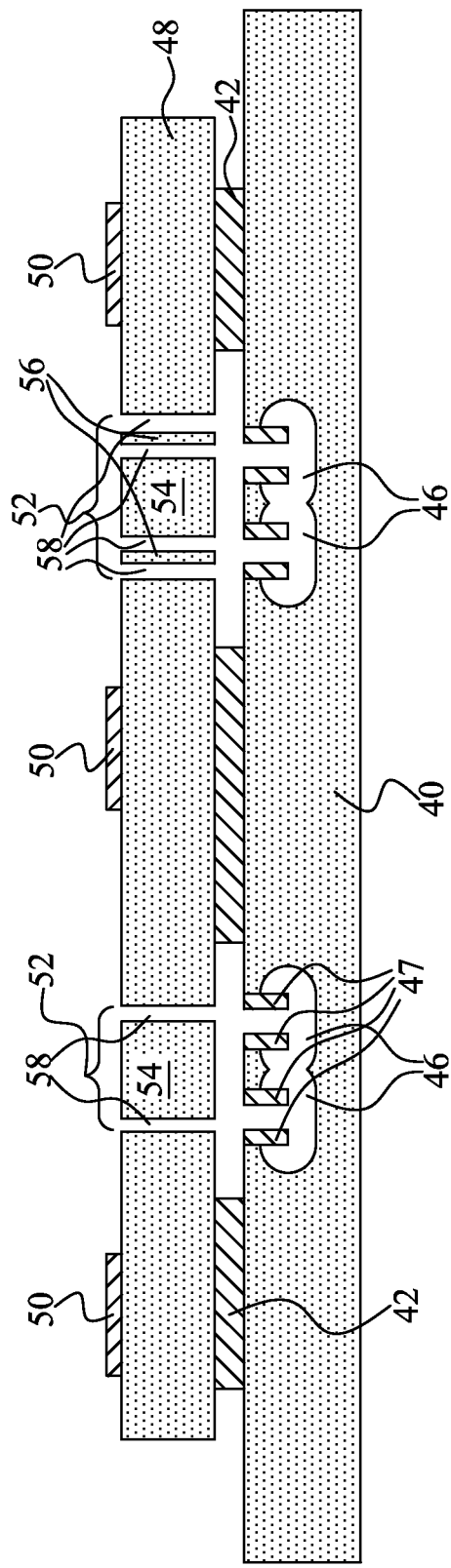
Figure 1H:
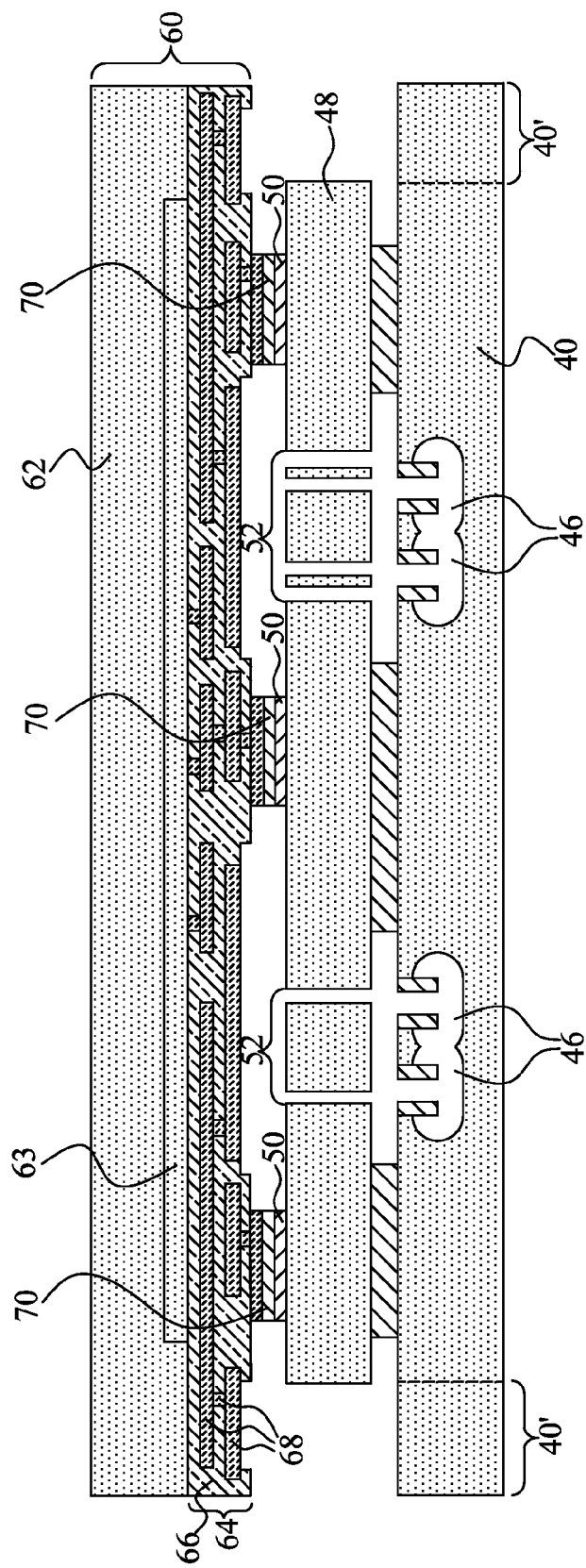

Next, as shown in FIG. 1G, an additional etch step, preferably wet etch, is performed to remove some portions of oxide layer 42. Portions of sidewall protection layers 47 (when formed of oxides), may also be removed. The step in FIG. 1G results in the further enlargement of the combined cavities comprising openings 46 and 58. The additional etch step is controlled, for example, by controlling the etch time, so that enough bonding areas remain between wafers 40 and 48, and wafers 40 and 48 remain bonded to each other reliably.

FIG. 1H illustrates the bonding of MEMS wafer 48 to Complementary Metal-Oxide-Semiconductor (CMOS) wafer 60. CMOS wafer 60 may include substrate 62. Substrate 62 may comprise a semiconductor material such as silicon, although other semiconductor materials may be used. CMOS devices 63 (such as transistors) are formed at a surface of substrate 62. Furthermore, interconnect structure 64 is formed to electrically couple to CMOS devices 63. Interconnect structure 64 may include dielectric layers 66, which further include low-k dielectric layers, non-low-k dielectric layers such as passivation layers, and the like. Metal lines and vias 68, which may be formed of copper, aluminum, and combinations thereof, are formed in the dielectric layers 66. CMOS wafer 60 is bonded to MEMS wafer 48 through eutectic bonding. For example, metal layers 70, which may be aluminum layers, or germanium layers, are bonded to bond layers 50. Metal layers 70, although illustrated as discrete layers, may form a ring overlapping the ring of bond layers 50.

Figure 1I:
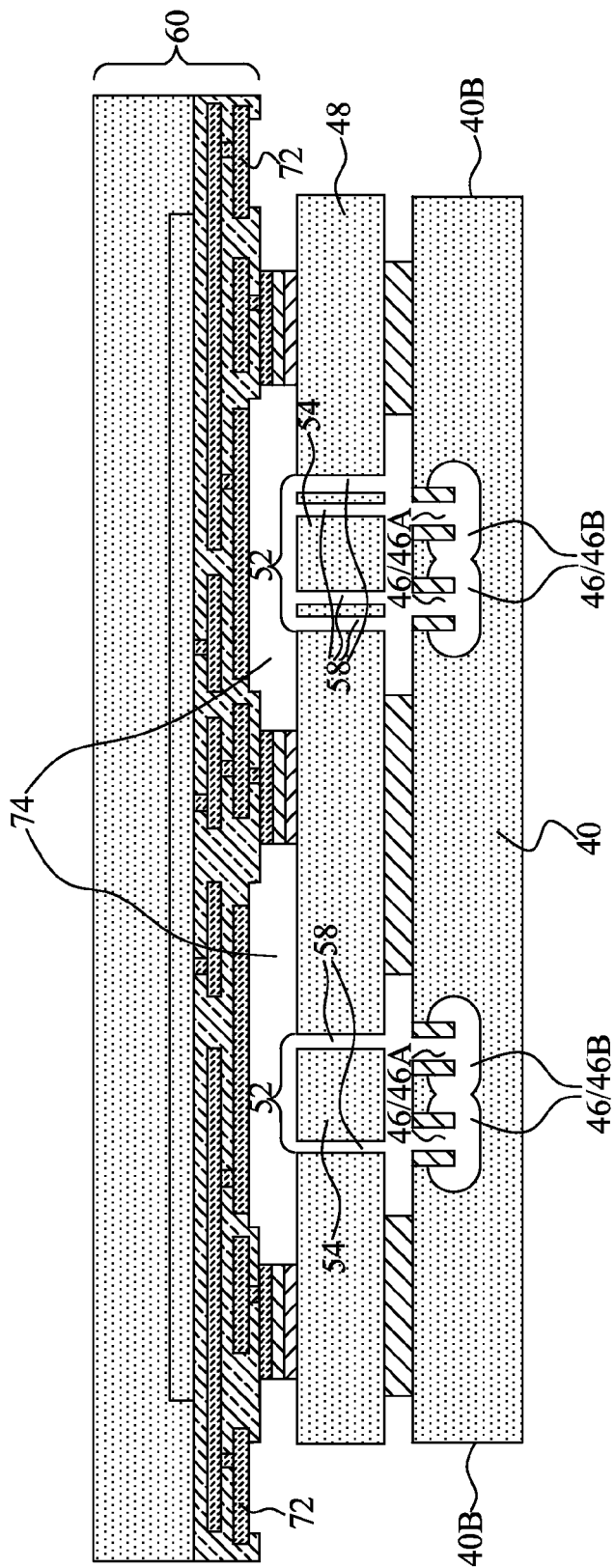

In a subsequent step, a pad opening step is performed. Portions 40' of wafer 40 are removed, for example, in an etching step or a grind-open step. The resulting structure is shown in FIG. 1I. Bond pads 72 in wafer 60 are hence no longer overlapped by wafer 40, and hence bonds may be performed on bond pads 72. Bond pads 72 may be used for wire bonding, for example. In some embodiments, the etching is anisotropic, and hence edges 40B of wafer 40 are substantially straight. Alternatively, portion 40' can be removed by a grind-open step, wherein a grinding wheel or blade is used to erase portion 40'. The formation of the MEMS-device-comprising package is thus finished.

In the embodiments shown in FIG. 1I, the cavities in which movable elements 54 of MEMS devices 52 are located include openings 46, 58, and 74, which are interconnected. Openings 46 are enlarged using the isotropic etching, and hence the total volume of the cavities is increased. Accordingly, the air pressure in the cavities is reduced, and the resistance to moveable elements 54 is reduced.

FIGS. 2A through 4G illustrate cross-sectional views and top views of intermediate stages in the formation of MEMS-device-comprising packages in accordance with alternative embodiments. Unless specified otherwise, the materials and formation methods of the components in these embodiments are essentially the same as the like components, which are denoted by like reference numerals in the embodiments shown in FIGS. 1A through 1I. The details regarding the formation process and the materials of the components shown in FIGS. 2A through 4G may thus be found in the discussion of the embodiment shown in FIGS. 1A through 1I.

Figure 2A:
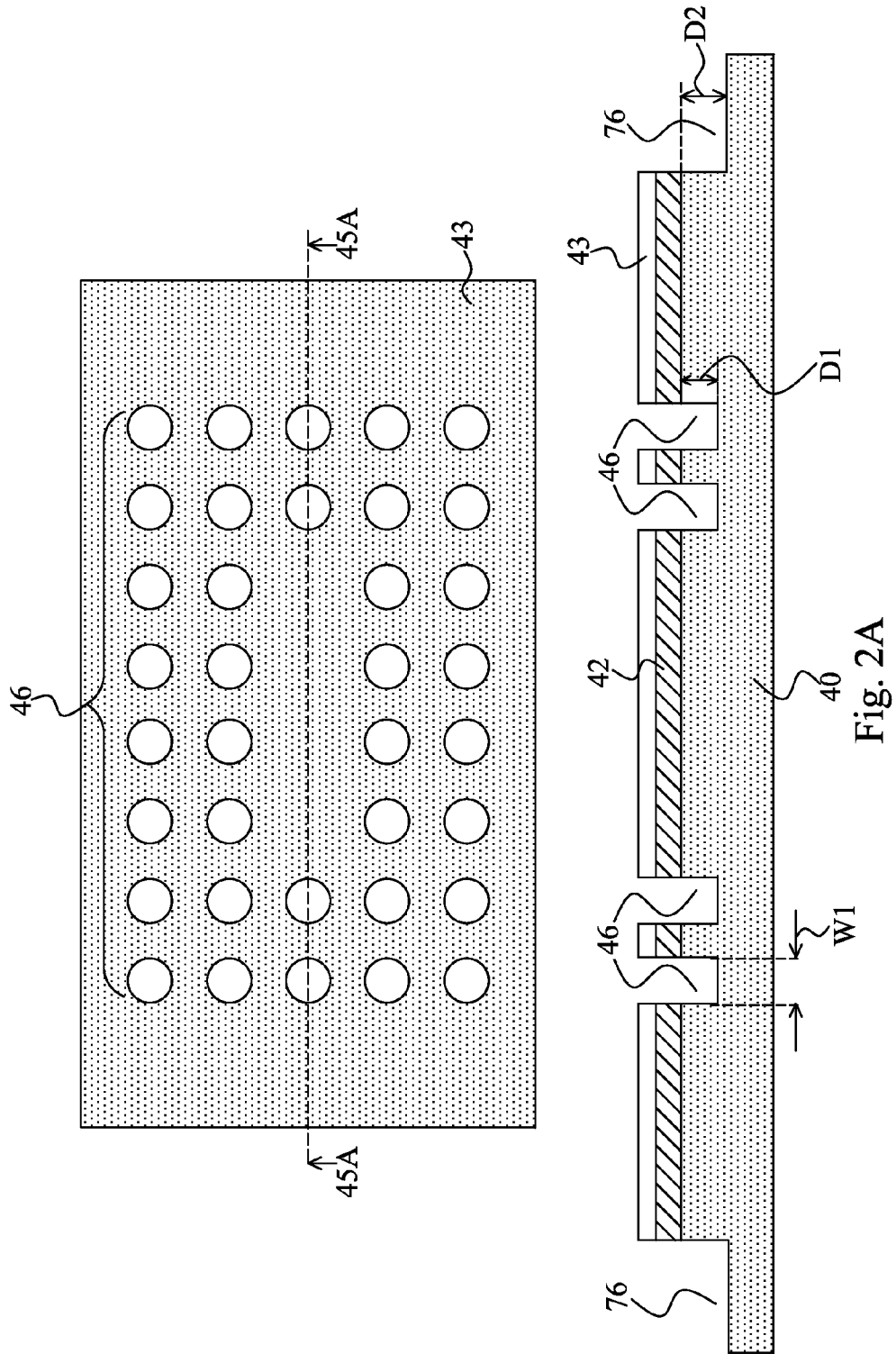
FIGS. 2A through 2I are cross-sectional views and top views of intermediate stages in the manufacturing of a package including a MEMS device in accordance with alternative exemplary embodiments, wherein air cavities are formed in a MEMS wafer through an anisotropic etching followed by an isotropic etching, and wherein pad openings are formed using pattern loading effect.
Figure 2B:
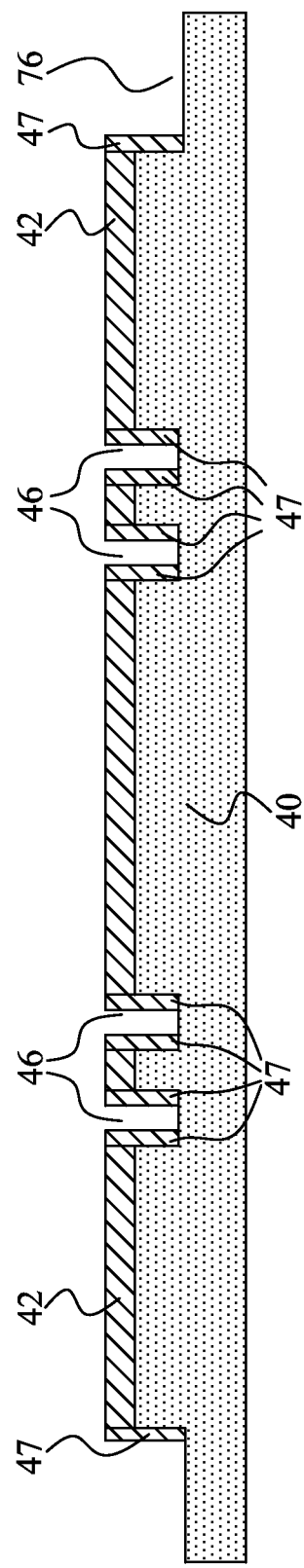
Figure 2C:
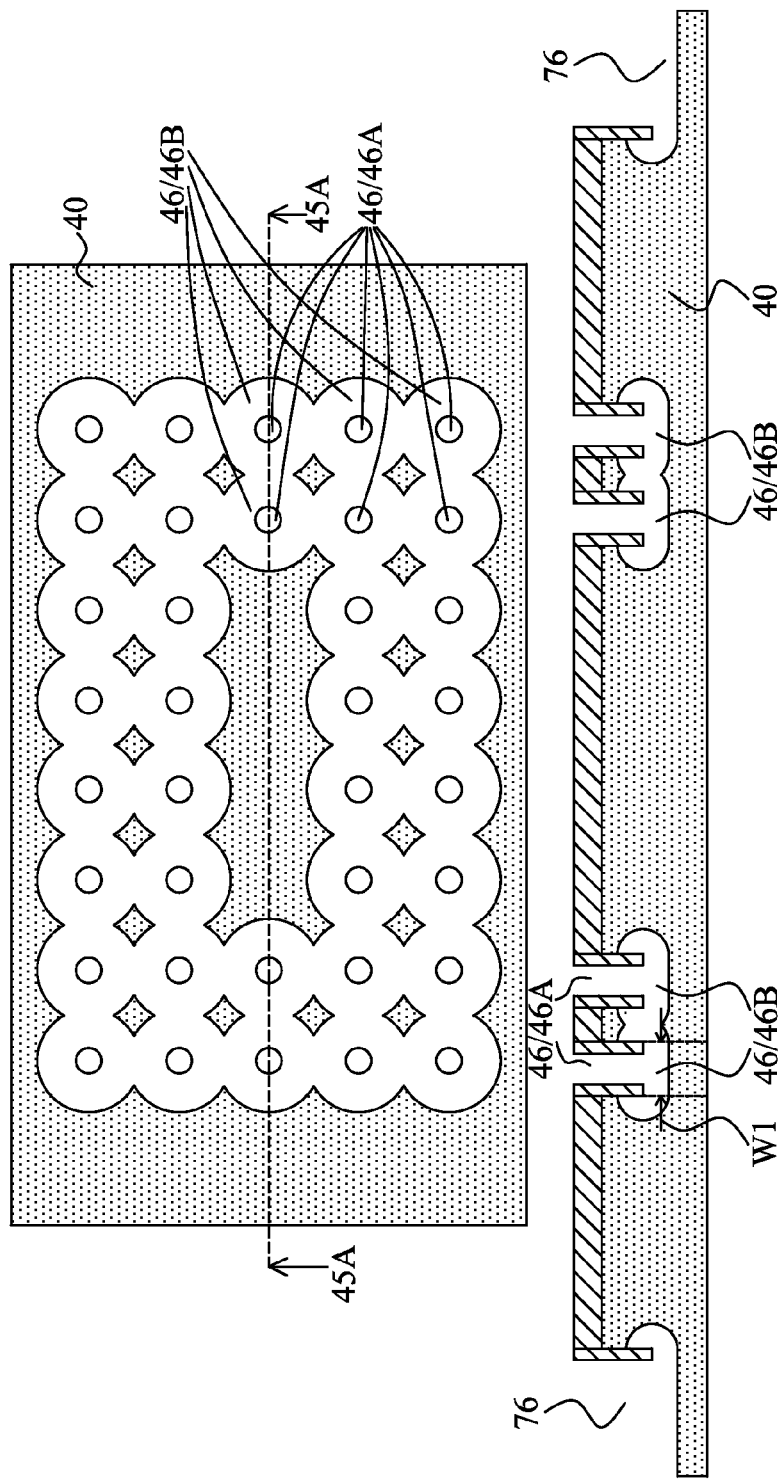
Figure 2D:
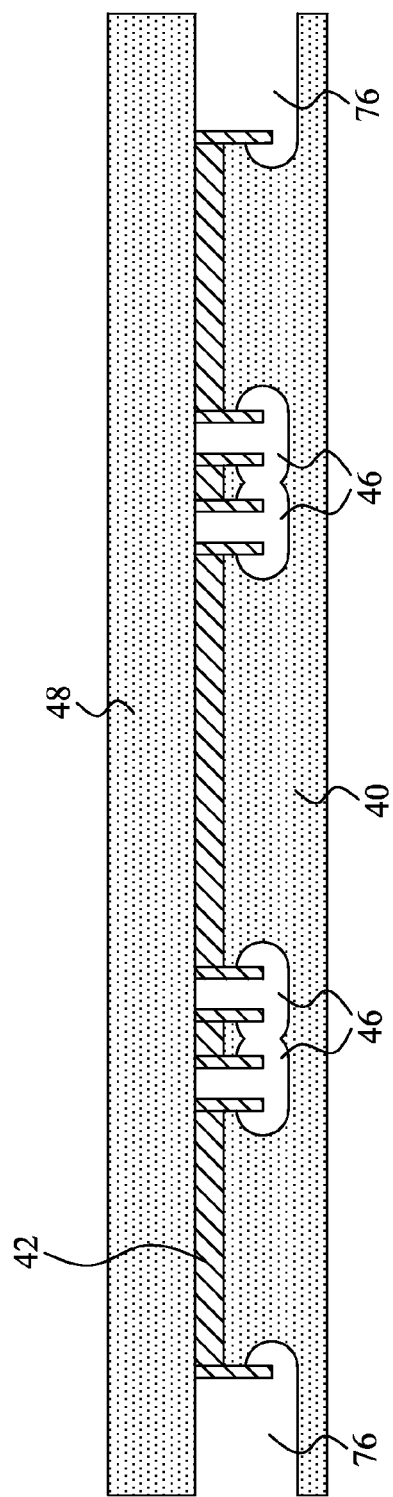
Figure 2E:
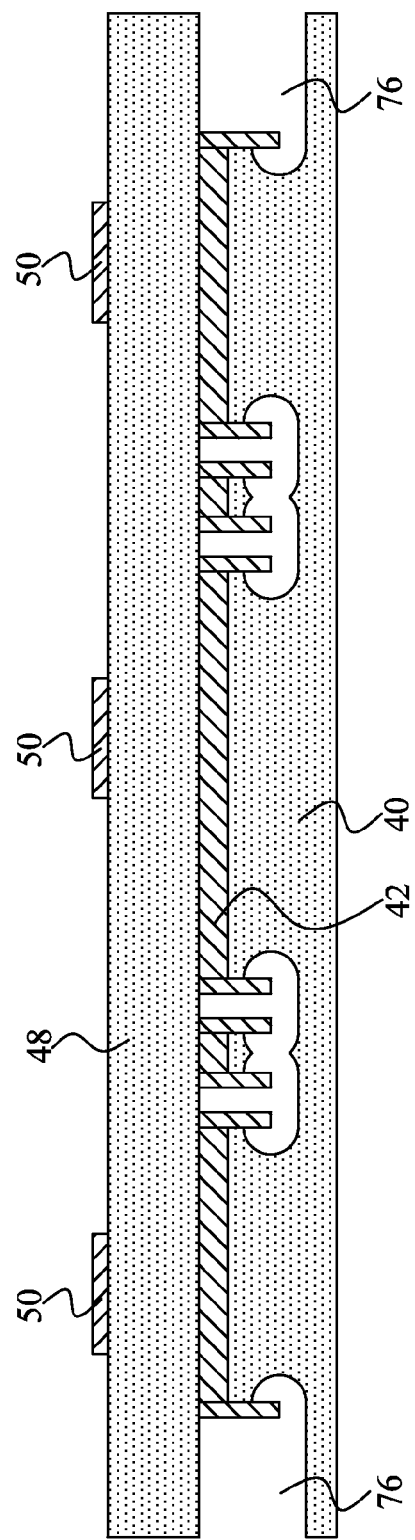
Figure 2F:
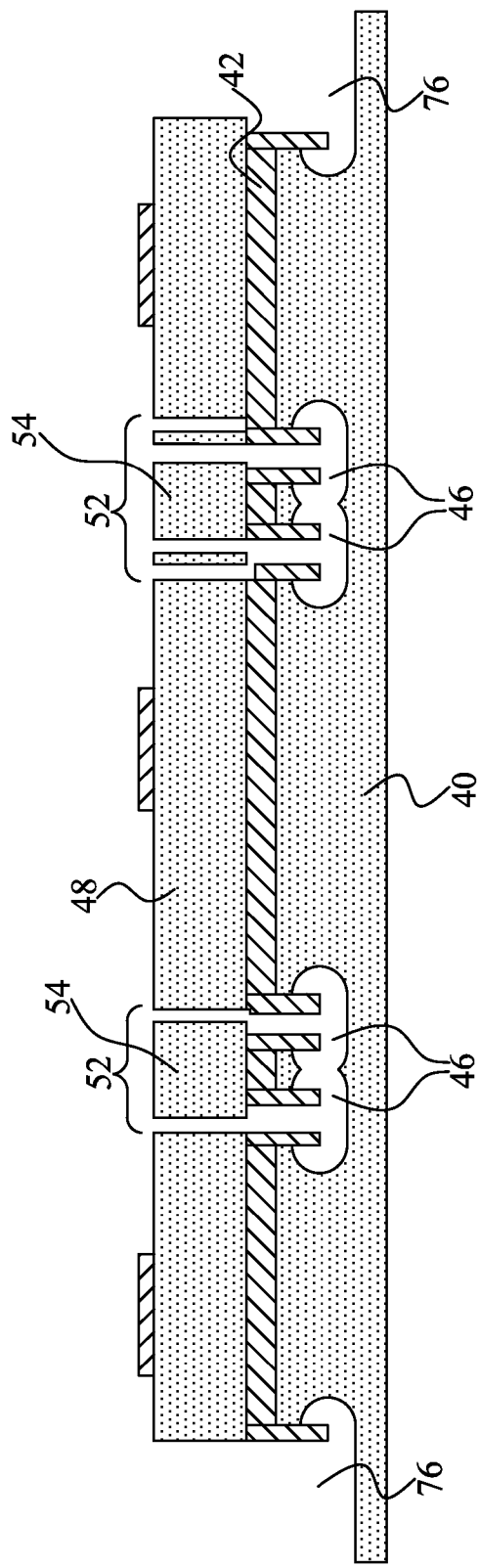
Figure 2G:
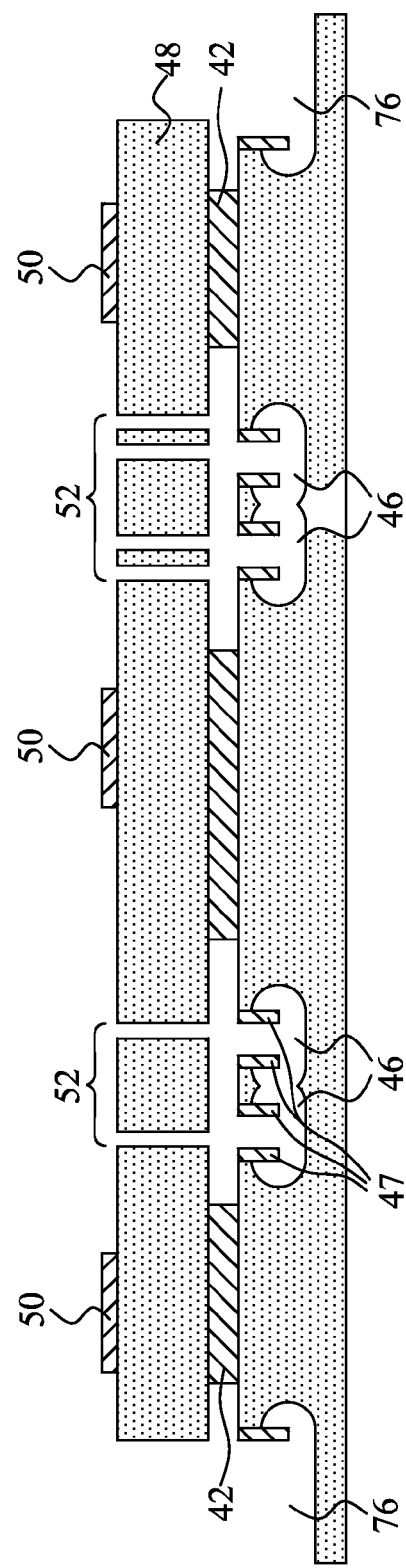
Figure 2H:
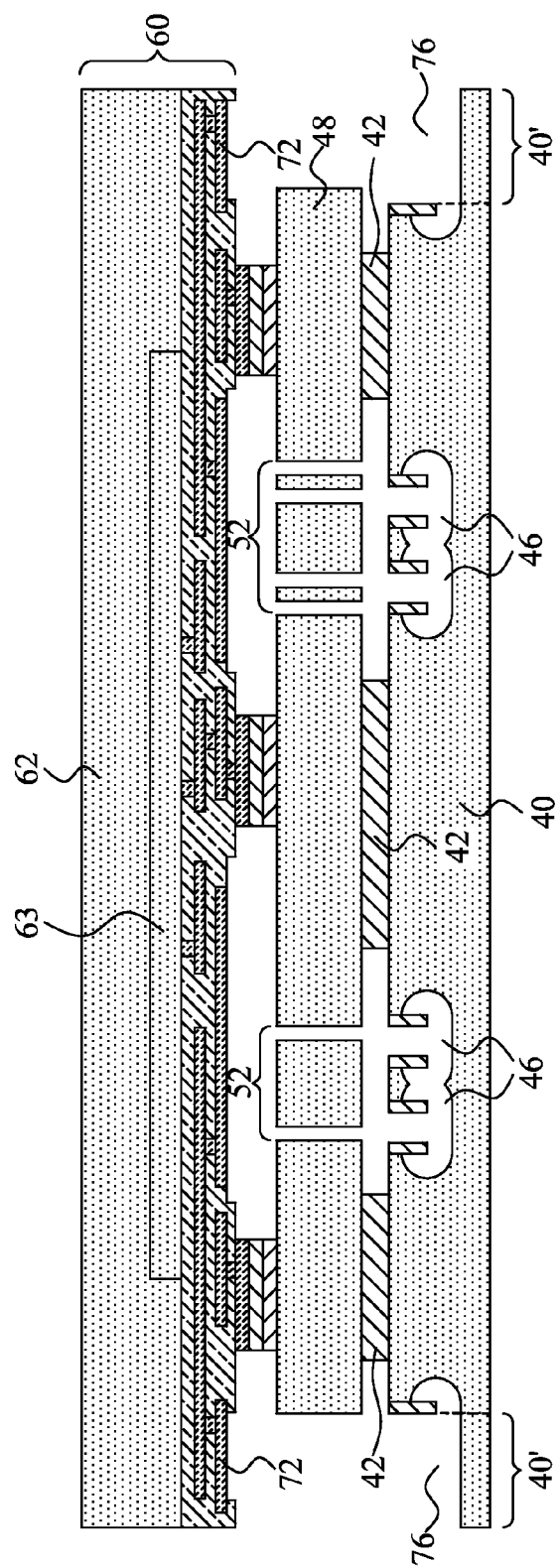
Figure 2I:
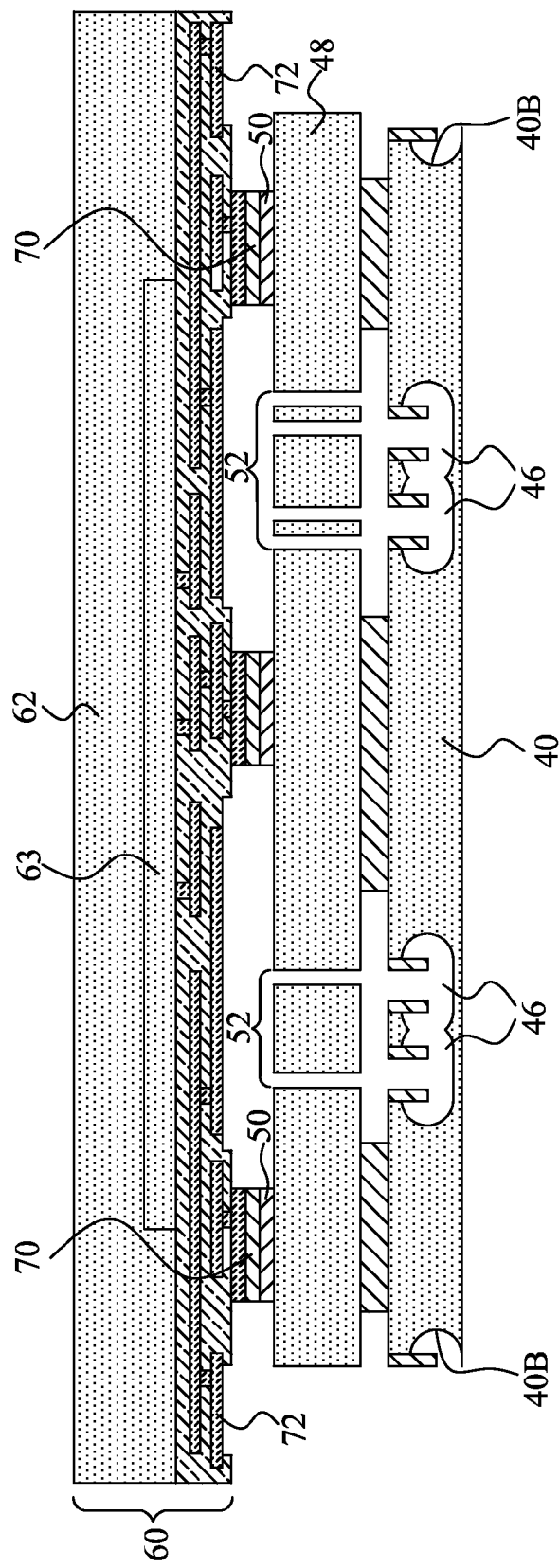

The embodiments shown in FIG. 2A through 2I are similar to the embodiments in FIGS. 1A through 1I, except that the pad opening step shown in FIG. 1I is performed through patterning loading effect. Accordingly, the etching step shown in FIG. 1I may be replaced by a wafer thinning step. Referring to FIG. 2A, openings 46 are formed using an anisotropic etching. At the time openings 46 are formed, pad openings 76 are also formed. The lateral sizes of pad openings 76 are greater than the lateral size W1 of openings 46. Since openings 46 are initially separated from each other, and the horizontal sizes of openings 46 are smaller than the horizontal sizes of pad openings 74, due to the pattern loading effect, depth D2 of pad openings 76 is greater than depth D1 of openings 46, although the combined lateral sizes of openings 46, after being merged, are greater than the lateral sizes of pad openings 74. Accordingly, by initially separating openings 46 and merging openings 46 later through the isotropic etching, there is a reversed pattern loading effect that is desirable for the pad opening step (FIG. 2I). In some embodiments, depth different (D2−D1) is greater than about 30 μm.

Next, as shown in FIG. 2B, sidewall protection layers 47 are formed in openings 46 and pad openings 76. FIG. 2C illustrates the isotropic etching to expand openings 46 and 76 laterally. Accordingly, the volume of openings 46 is increased without increasing the top width W1. In FIG. 2D, MEMS wafer 48 is bonded to wafer 40 through fusion bonding, for example. Next, referring to FIG. 2E, bond layers 50 are formed on MEMS wafer 48. FIG. 2F illustrates the formation of MEMS devices 52 through the etching of MEMS wafer 48. Next, as shown in FIG. 2G, an additional etching is performed to remove some of oxide layer 42. Some or all of sidewall protection layers 47 may also be etched when sidewall protection layers 47 are formed of an oxide. The bonding of CMOS wafer 60 to wafer 48 is illustrated in FIG. 2H. The details of FIGS. 2B through 2H may be found referring to the embodiments in FIGS. 1B through 1I.

A pad opening step is then performed through the thinning of wafer 40, which may be performed by grinding wafer 40. Portions 40' of wafer 40 are thus removed. The resulting structure is shown in FIG. 2I. In the resulting structure, edges 40B of wafer 40 are curved since formed by the anisotropic etching step in FIG. 2C. Since pad openings 76 (FIG. 2H) are deeper than openings 46, after portions 40' (FIG. 2H) that are vertically aligned to bond pads 72 are grinded, there are still leftover portions of wafer 40 overlapped by openings 46, and the leftover portions of wafer 40 keep openings 46 sealed. By adopting the thinning step to open the access to bond pads 72, the lithography mask that is used for the pad opening step is saved.

Figure 3A:
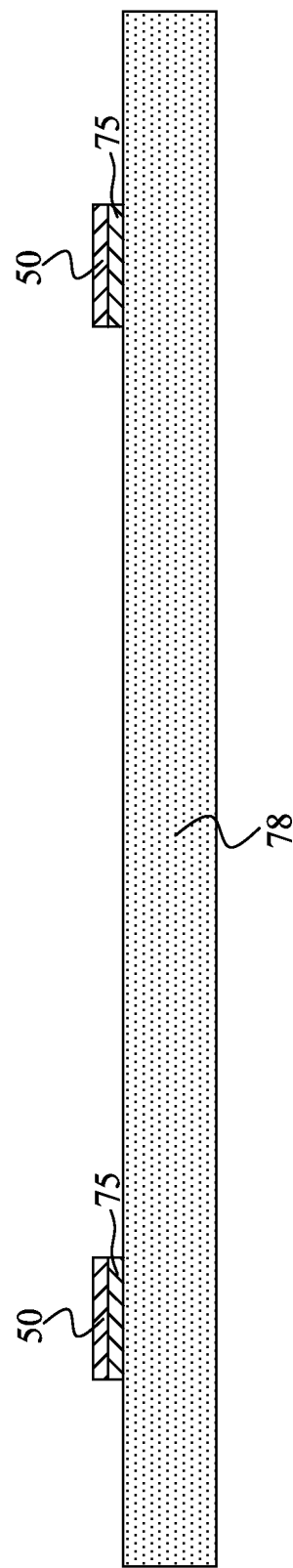
FIGS. 3A through 3F are cross-sectional views of intermediate stages in the manufacturing of a package including a MEMS device in accordance with alternative exemplary embodiments, wherein air cavities are formed in a cap wafer through an anisotropic etching followed by an isotropic etching.

FIGS. 3A through 3F illustrate cross-sectional views of intermediate stages in the formation of MEMS-device-comprising packages in accordance with alternative embodiments. In these embodiments, the anisotropic and the isotropic etching are used to form cavities in a cap wafer. Referring to FIG. 3A, cap wafer 78 is provided. Cap wafer 78 may be a silicon wafer, although other types of semiconductor wafers, dielectric wafers, or the like, may also be used. Dielectric layers 75 and bond layers 50 are formed on cap wafer 78. Dielectric layers 75 and bond layers 50 may form a ring in a top view of cap wafer 78.

Figure 3B:
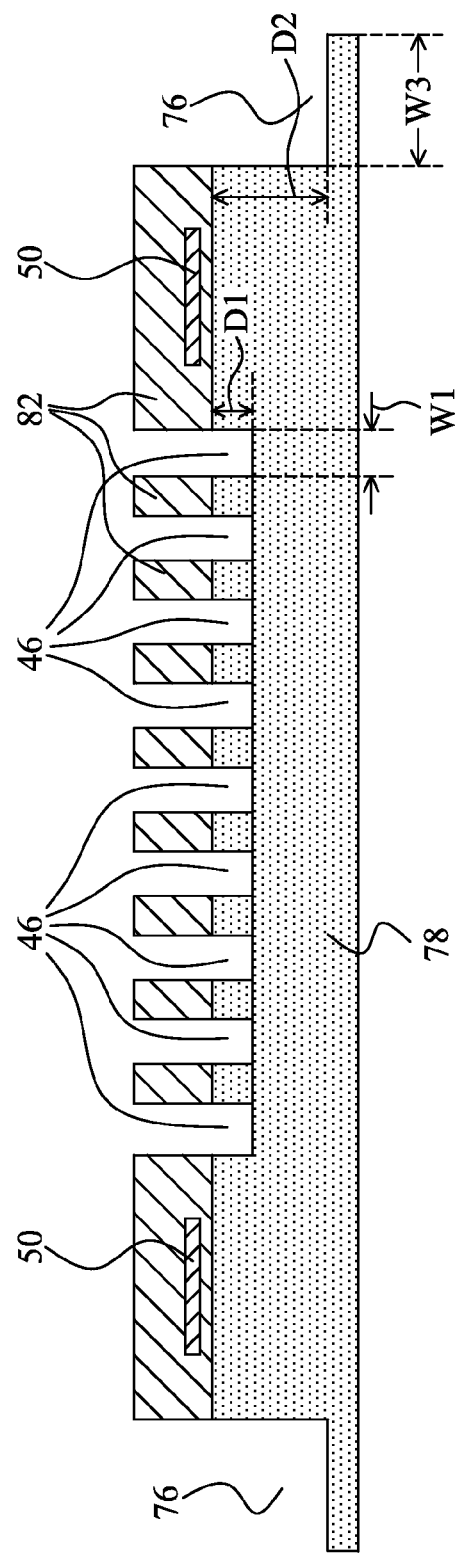
Figure 3C:
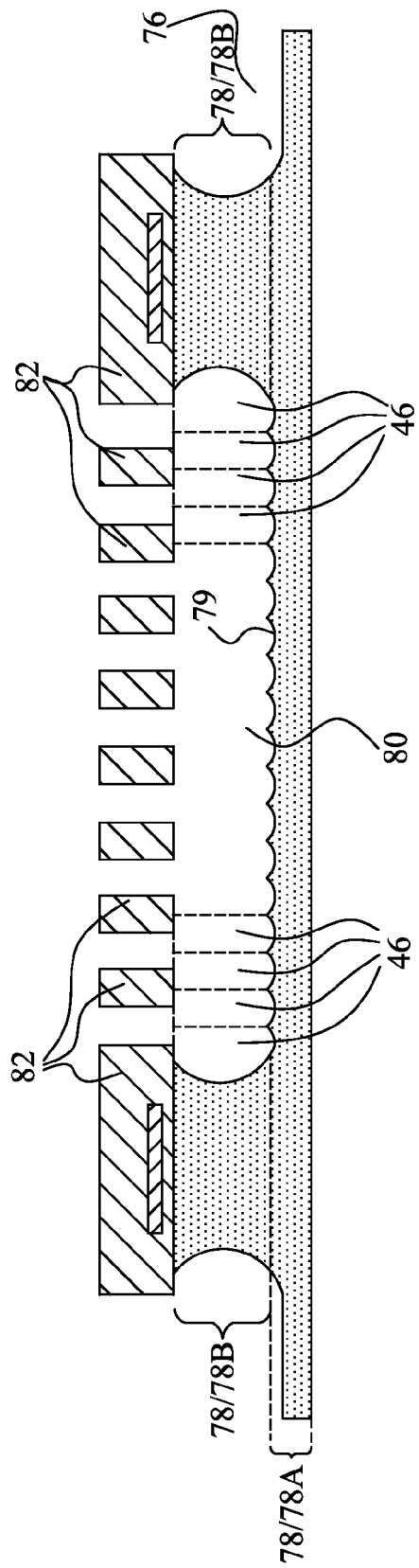

Referring to FIG. 3B, photo resist 82 is formed and patterned. Next, an anisotropic etching is performed to form openings 46 and pad openings 76 in cap wafer 78. Openings 46 and pad openings 76 have width W1 and W3 (FIG. 3B), respectively, with width W3 greater than width W1. Accordingly, depths D2 is greater than depth D1. Referring to FIG. 3C, an isotropic etching like wet etch is performed to expand openings 46, so that openings 46 are interconnected to form a large opening, which is referred to as opening 80 hereinafter. The portions of wafer 78, which portions are over openings 46, are eventually fully removed, and no portion of wafer 78 is over the interconnected openings 46, unlike the embodiments shown in FIGS. 1A through 2I. Due to the formation of the large opening 80 that comprises a plurality of openings 46 therein, cap wafer 78 has the shape of a cover. The resulting cap wafer 78 includes a cover portion 78A and edge ring 78B connected to cover portion 78A. The inner surface 79 of the cover portion 78A, which surface is inside opening 80, comprises a plurality of curved portions due to the isotropic formation. Furthermore, the edges and inner surfaces of edge ring 78B are also curved due to the isotropic formation.

Figure 3D:
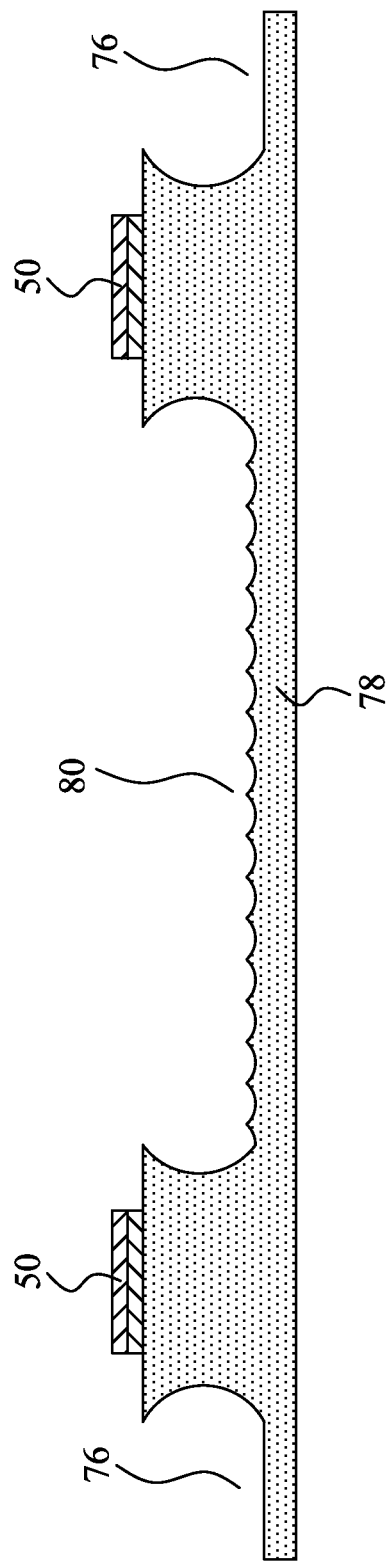
Figure 3E:
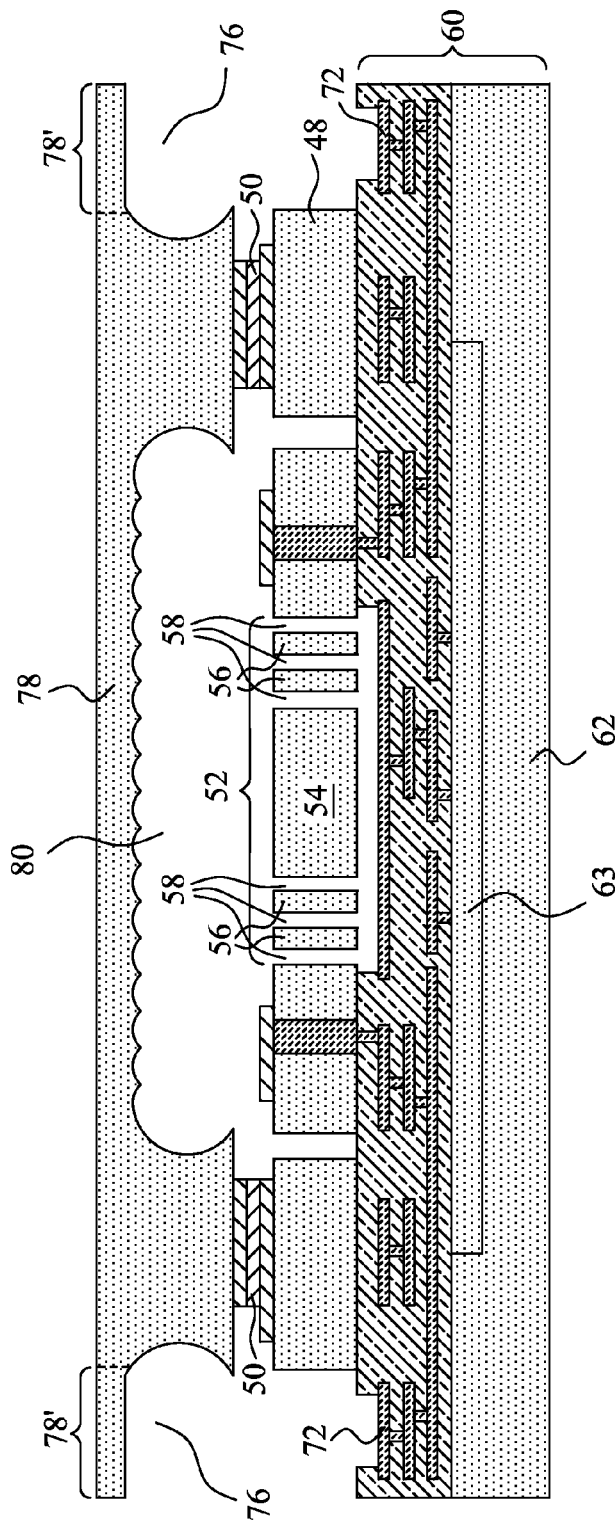

Photo resist 82 is then removed, and the resulting structure is shown in FIG. 3D. Next, as shown in FIG. 3E, cap wafer 78 is bonded to MEMS wafer 48, which is further bonded to CMOS wafer 60. Wafers 48 and CMOS wafer 60 may be essentially the same as in the embodiments shown in FIGS. 1A through 2I. The formation of wafers 48 and 60 may include bonding a blanket MEMS wafer 48 onto wafer 60, for example, through fusion bonding, and thinning and etching MEMS wafer 48 to form MEMS devices 52 and openings 58. Wafer 48 comprises MEMS device(s) 52 therein, which further include movable element(s) 54 and springs 56. Large opening 80 overlaps MEMS devices 52. Accordingly, movable elements 54 may move into large opening 80 during the operation of MEMS devices 52. Cap wafer 78 seals openings 80 and 58 therein.

Figure 3F:
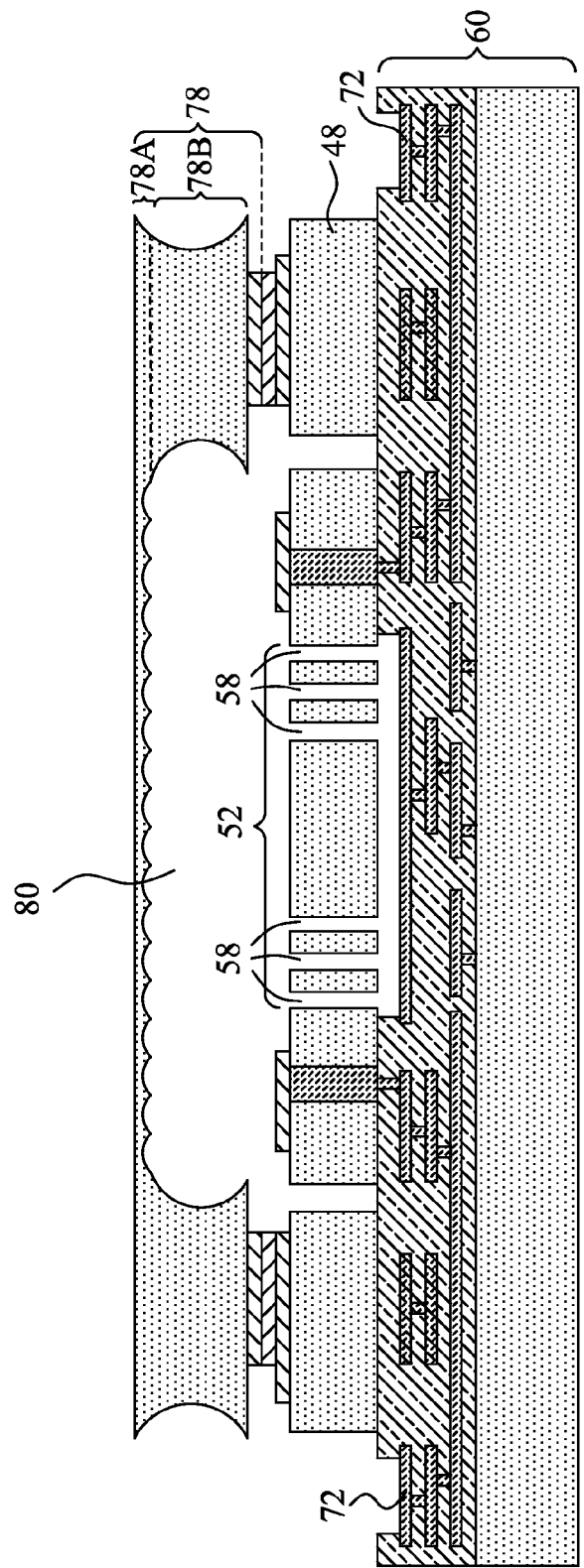

FIG. 3F illustrates the pad opening step, which is performed by thinning cap wafer 78. Portions 78' (FIG. 3E) are removed by the thinning step, and hence bond pads 72 in CMOS wafer 60 are exposed. Due to the depth difference between openings 80 and 76 (FIG. 3E), after portions 78' are removed, there is a leftover portion of cap wafer 78, which leftover portion overlaps and seals openings 58 and 80.

Figure 4A:
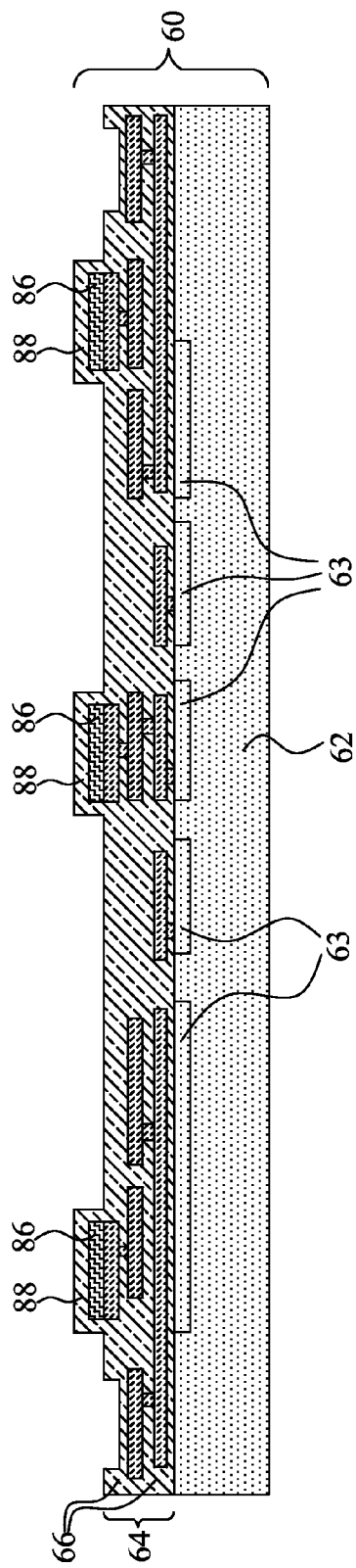
FIGS. 4A through 4G are cross-sectional views of intermediate stages in the manufacturing of a package including a MEMS device in accordance with alternative exemplary embodiments, wherein air cavities are formed in a Complementary Metal-Oxide-Semiconductor (CMOS) wafer through an anisotropic etching followed by an isotropic etching.

FIGS. 4A through 4G illustrate cross-sectional views of intermediate stages in the formation of MEMS-device-comprising packages in accordance with alternative embodiments. In these embodiments, the anisotropic and the isotropic etching are used to form cavities in CMOS wafer 60. Referring to FIG. 4A, CMOS wafer 60 is provided. CMOS wafer 60 includes semiconductor substrate 62 (a silicon substrate, for example), and CMOS devices 63 at a surface of semiconductor substrate 62. Interconnect structure 64 is formed over and connected to CMOS devices 63.

In some embodiments, bond material 86 is formed at the top surface of CMOS wafer 60, followed by the formation of mask layer 88. Bond material 86 may comprise a material selected from the group consisting of aluminum, germanium, indium, gold, tin, and combinations thereof. Bond material 86 may also form a ring. Mask layer 88 may be formed of a dielectric material such as silicon oxide, silicon nitride, or the like.

Figure 4B:
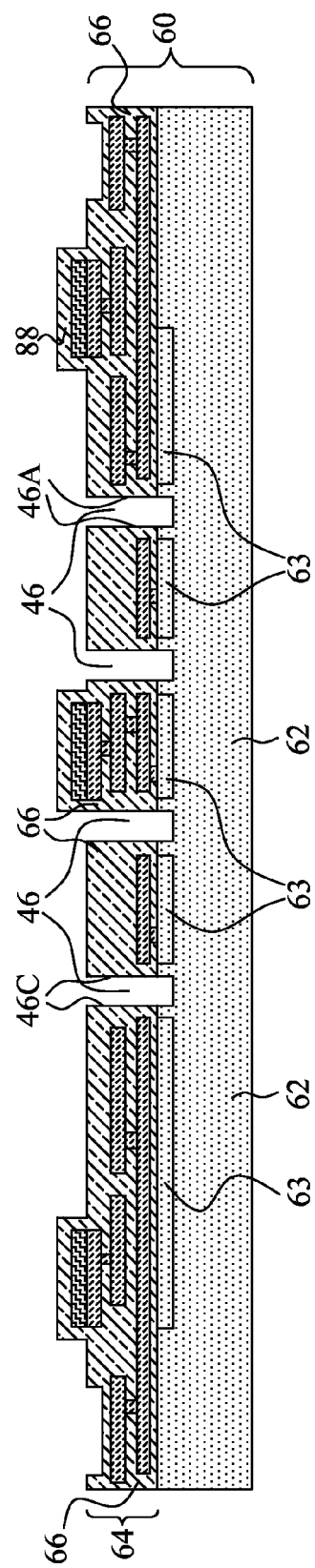
Figure 4C:
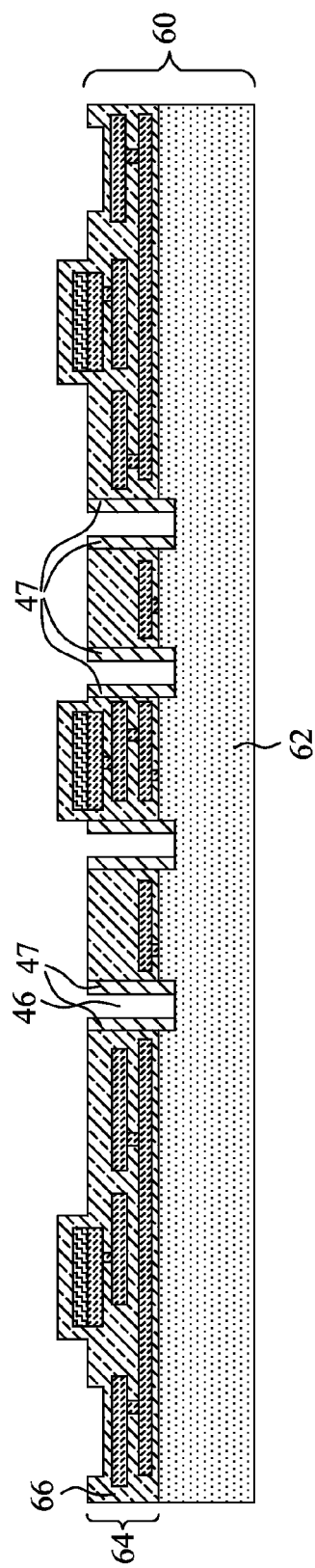

Next, as shown in FIG. 4B, mask layer 88, dielectric layers 66 in interconnect structure 64, and substrate 62 are etched through an anisotropic etching, so that the resulting openings 46 extend into substrate 62. Openings 46 may be aligned to portions of interconnect structure 64 that do not include metal lines and vias. Accordingly, in the formation of openings 46, no metal lines and vias in interconnect structure 64 are etched. Openings 46 have substantially vertical sidewalls 46C. Next, as shown in FIG. 4C, sidewall protection layers 47 are formed in openings 46, and on the sidewalls of dielectric layers 66 and the sidewalls of substrate 62, which sidewalls of substrate 62 are in openings 46. Some bottoms of openings 46 are not covered by sidewall protection layers 47 since the layer was removed by a etch-back step to remove its portion on the bottoms of openings 46.

Figure 4D:
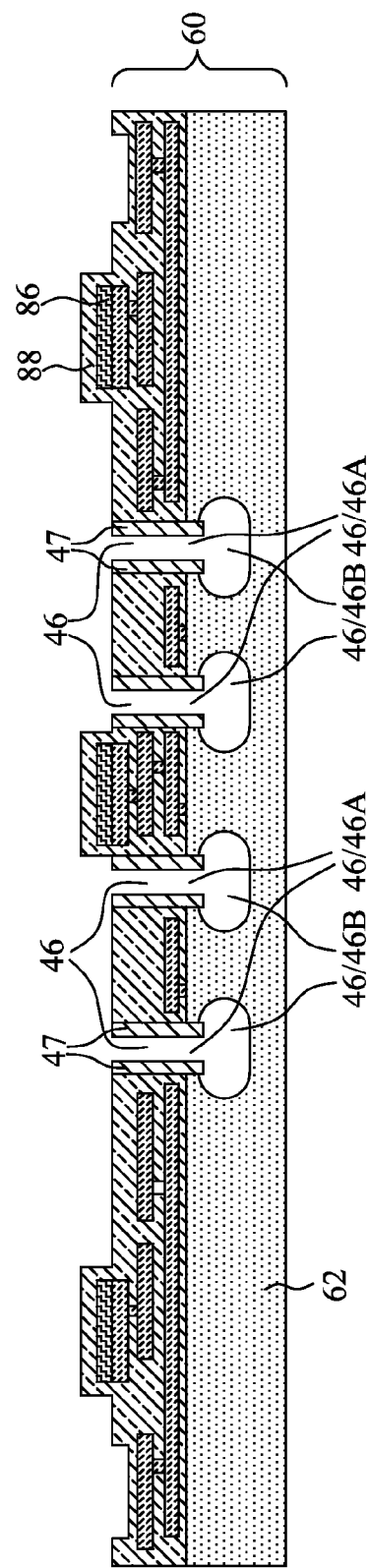

Referring to FIG. 4D, an isotropic etching, for example a wet etch, is performed to enlarge openings 46 laterally and vertically. The sidewalls of substrate 62 in openings 46 are protected by sidewall protection layers 47, and are not etched. Although FIG. 4D shows that the enlarged openings 46 are discrete openings separate from each other, the enlarged openings 46 may be interconnected, similar to the embodiments shown in FIG. 1I.

Figure 4E:
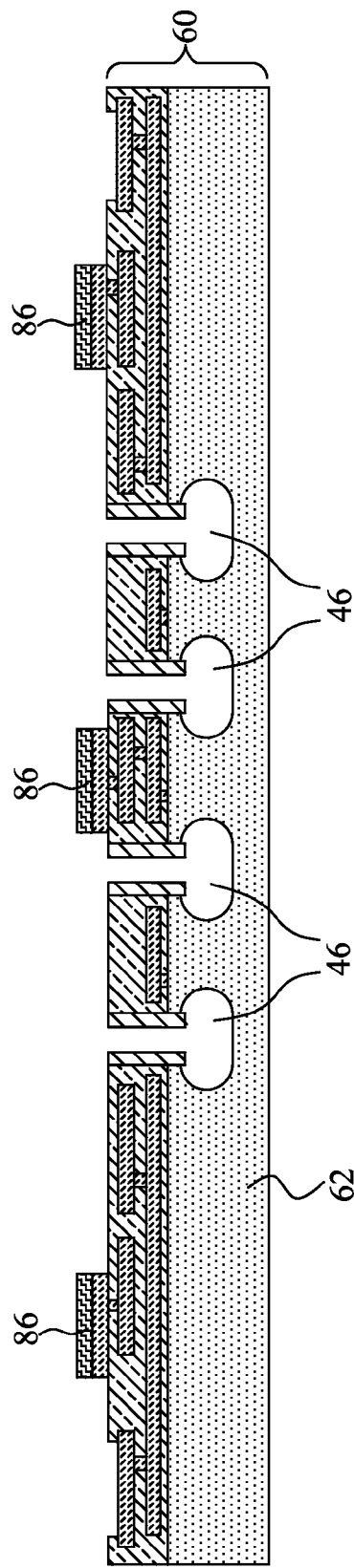
Figure 4F:
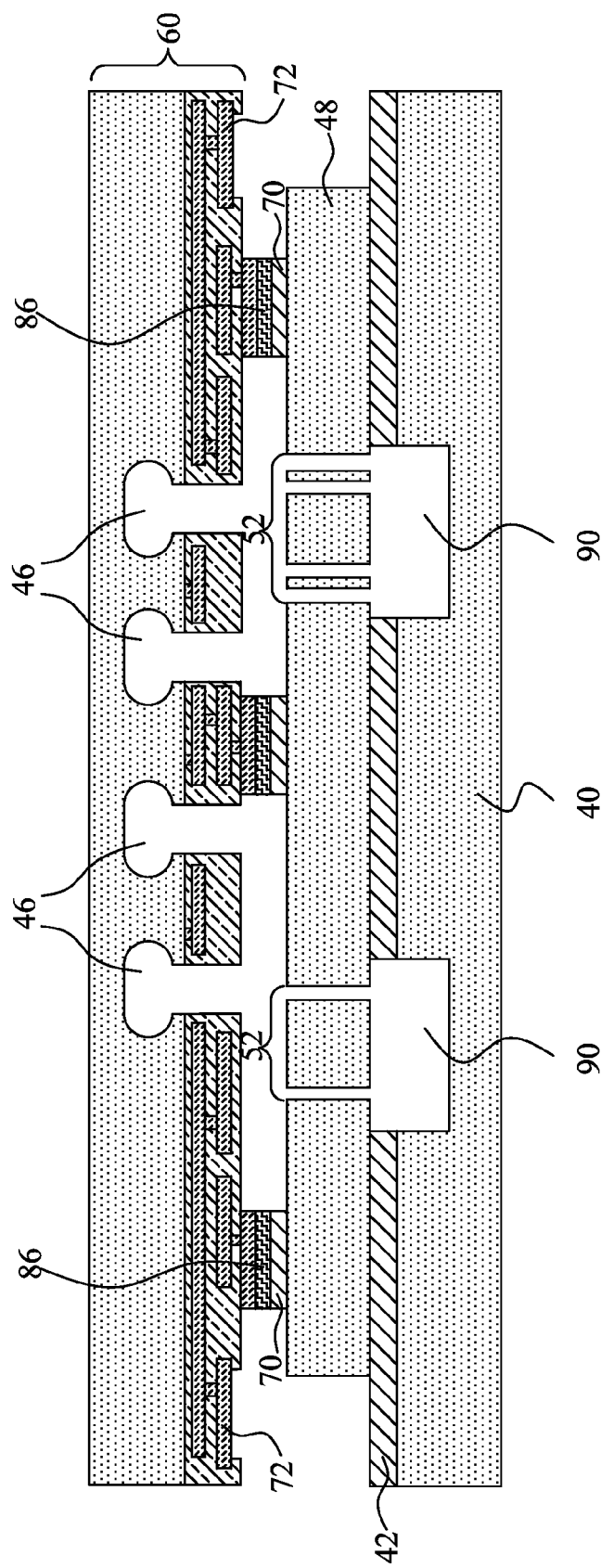

In FIG. 4E, mask layers 88 are removed, and bond material 86 is exposed. In a subsequent step, as shown in FIG. 4F, CMOS wafer 60 is bonded to MEMS wafer 48 through eutectic bonding, wherein bond material 86 is bonded to bond layer 70, which may comprise aluminum (or aluminum copper), for example. MEMS wafer 48 is further bonded to wafer 40, for example, through fusion bonding (the bonding between oxide layer 42 and wafer 48). The bonding of MEMS wafer 48 to wafer 40 may be performed before or after the bonding of CMOS wafer 60 to MEMS wafer 48. The exemplary bonding process may include forming oxide layer 42 on wafer 40, patterning oxide layer 42 and wafer 40 to form openings 90, and bonding blanket wafer 48 to oxide layer 42. After the bonding of blanket wafer 48 to wafer 40, and before further bonding CMOS wafer 60 to wafer 48, a patterning step is performed to form MEMS devices 52 in MEMS wafer 48. Portions of wafer 48 that overlap bond pads 72 may be removed when MEMS devices 52 are formed.

Figure 4G:
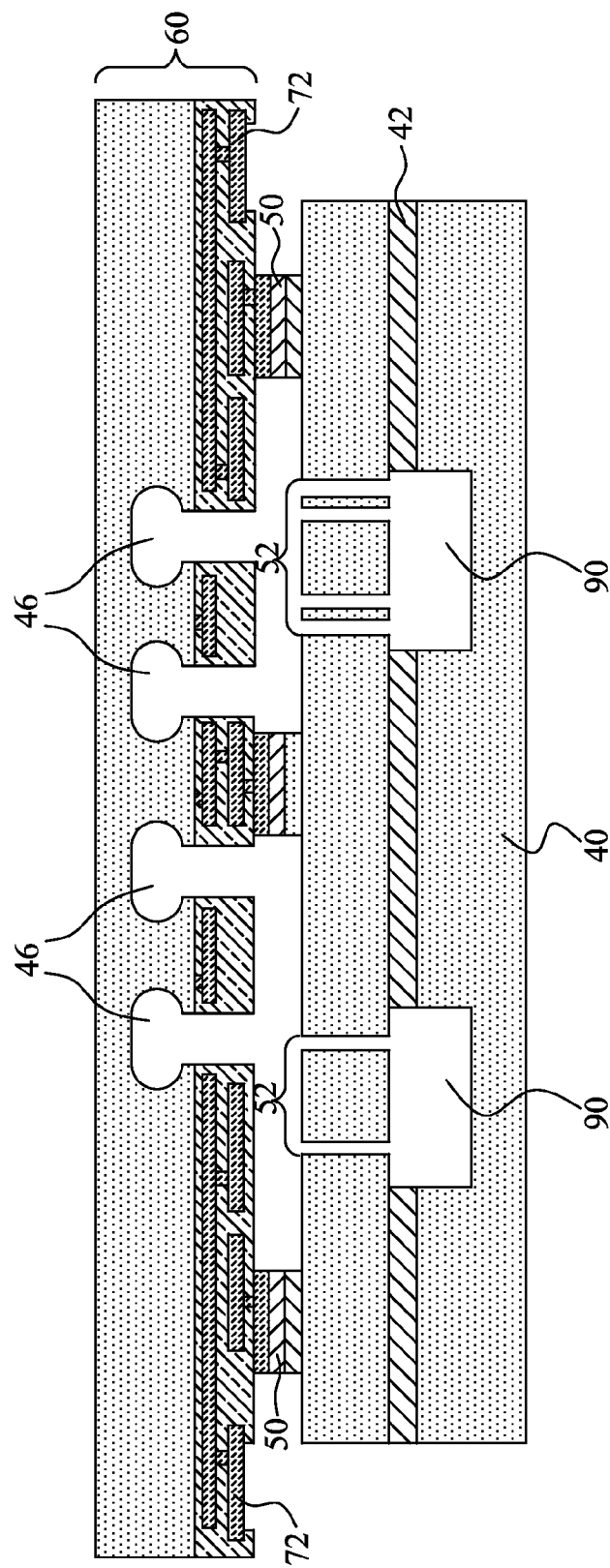

FIG. 4G illustrates a pad opening step, wherein portions of wafer 40 and oxide layer 42 in FIG. 4E that overlap bond pads 72 are etched or grind-opened, and hence bond pads 72 are exposed. The MEMS-device-comprising package is thus formed. In the process in FIGS. 4A through 4G, openings 46, whose formation include anisotropic etching and isotropic etching following the anisotropic etching, form portions of the cavities, in which the movable elements 52 of MEMS devices 52 are located.

In the embodiments, by performing an anisotropic etch to form openings, forming sidewall protection layers in the openings, and performing an isotropic etching, the resulting openings have greater internal sizes and smaller entries. Accordingly, the bonding area of wafers is not adversely reduced by the enlargement of the openings. The reliability of the bonds of the wafers involved in the MEMS-device-comprising packages is thus maintained. The enlargement of the openings results in the increase in the total volumes of the cavities, in which the MEMS devices are located. The performance of the MEMS devices is thus improved due to the reduction in the air pressure in the cavities.

In accordance with embodiments, a device includes a MEMS wafer having a MEMS device therein. The MEMS device includes a movable element, and first openings in the MEMS wafer. The movable element is disposed in the first openings. A carrier wafer is bonded to the MEMS wafer. The carrier wafer includes a second opening connected to the first openings, wherein the second opening includes an entry portion extending from a surface of the carrier wafer into the carrier wafer, and an inner portion wider than the entry portion, wherein the inner portion is deeper in the carrier wafer than the entry portion.

In accordance with other embodiments, a device includes a MEMS wafer having a MEMS device therein. The MEMS device includes a movable element, and first openings in the MEMS wafer. The movable element is disposed in the first openings. A carrier wafer is disposed underlying and bonded to the MEMS wafer, wherein the carrier wafer includes a second opening connected to the first openings. The second opening includes an entry portion extending from a surface of the carrier wafer into the carrier wafer, wherein the entry portion has substantially straight sidewalls, and an inner portion deeper in the carrier wafer than the entry portion. The inner portion has a curved bottom and curved sidewalls. A CMOS wafer is overlying and bonded to the MEMS wafer, wherein the CMOS wafer and the carrier wafer are on opposite sides of the MEMS wafer. The CMOS wafer includes CMOS devices therein.

In accordance with yet other embodiments, a method includes performing an anisotropic etching on a carrier wafer to form a first plurality of openings that have substantially vertical sidewalls, and forming protection layers in the first plurality of openings, wherein the protection layer includes sidewall portions on the substantially vertical sidewalls of the first plurality of openings. The bottoms of the first plurality of openings are uncovered by the protection layer. An isotropic etching is performed to expand the first plurality of openings. Each of the first plurality of openings includes an entry portion extending from a surface of the carrier wafer into the carrier wafer, and an inner portion wider than the entry portion. The inner portion is deeper in the carrier wafer than the entry portion. An additional wafer is bonded to the carrier wafer. The additional wafer is etched to form a MEMS device in the additional wafer. The MEMS device is located in a cavity that includes the first plurality of openings.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a Micro-Electro-Mechanical System (MEMS) wafer comprising a MEMS device therein, wherein the MEMS device comprises:
a movable element;
first openings in the MEMS wafer, with the movable element in the first openings;
a carrier wafer bonded to the MEMS wafer, wherein the carrier wafer comprises a second opening connected to the first openings, and wherein the second opening comprises:
an entry portion extending from a surface of the carrier wafer into the carrier wafer; and
an inner portion wider than the entry portion, wherein the inner portion is deeper in the carrier wafer than the entry portion.

2. The device of claim 1, wherein the entry portion of the second opening comprises substantially vertical sidewalls that are substantially perpendicular to the surface of the carrier wafer, and wherein sidewalls of the inner portion of the second opening are curved.

3. The device of claim 1, wherein the carrier wafer is free from Complementary Metal-Oxide-Semiconductor (CMOS) devices therein.

4. The device of claim 3 further comprises a CMOS wafer bonded to the MEMS wafer, wherein the CMOS wafer and the carrier wafer are on opposite sides of the MEMS wafer, and wherein the CMOS, wafer comprises CMOS devices therein.

5. The device of claim 4, wherein the CMOS wafer comprises a bond pad, wherein the carrier wafer is misaligned with the bond pad, and wherein an edge of the carrier wafer adjacent to the bond pad is substantially straight.

6. The device of claim 4, wherein the CMOS wafer comprises a bond pad, wherein the carrier wafer is misaligned with the bond pad, and wherein an edge of the carrier wafer adjacent to the bond pad is curved.

7. The device of claim 1, wherein the carrier wafer is a cap wafer comprising:
a cover portion; and
an edge ring connected to the cover portion, wherein the cover portion is aligned to the MEMS device, wherein the cover portion and the edge ring define the second opening, wherein the cover portion comprises an inner surface exposed to the second opening, and the edge ring comprises inner edges exposed to the second opening, and wherein the inner surface and the edge ring are curved.

8. The device of claim 1, wherein the carrier wafer is a CMOS wafer comprising:
a semiconductor substrate; and
an interconnect structure comprising:
dielectric layers; and
metal lines and vias in the dielectric layers, wherein the second opening extends into the dielectric layers and the semiconductor substrate.

9. A device comprising:
a Micro-Electro-Mechanical System (MEMS) wafer comprising a MEMS device therein, wherein the MEMS device comprises:
a movable element; and
first openings in the MEMS wafer, with the movable element in the first openings;
a carrier wafer underlying and bonded to the MEMS wafer, wherein the carrier wafer comprises a second opening connected to the first openings, and wherein the second opening comprises:
an entry portion extending from a surface of the carrier wafer into the carrier wafer, wherein the entry portion has substantially straight sidewalls; and
an inner portion deeper in the carrier wafer than the entry portion, wherein the inner portion comprises a curved bottom and curved sidewalls; and
a Complementary Metal-Oxide-Semiconductor (CMOS) wafer overlying and bonded to the MEMS wafer, wherein the CMOS wafer and the carrier wafer are on opposite sides of the MEMS wafer, and wherein the CMOS wafer comprises CMOS devices therein.

10. The device of claim 9, wherein the inner portion has first lateral size greater than a second lateral size of the entry portion.

11. The device of claim 9, wherein the carrier wafer further comprises a suspended portion overlapping the inner portion of the second opening and underlying the MEMS device.

12. The device of claim 11, wherein the suspended portion comprises a semiconductor material.

13. The device of claim 11 further comprising a dielectric layer that comprises portions on opposite sides of, and contacting, the suspended portion, wherein the dielectric layer extends into the inner portion of the second opening.

14. The device of claim 9, wherein the CMOS wafer comprises a bond pad, with the carrier wafer misaligned to the bond pad, and wherein an edge of the carrier wafer adjacent to the bond pad is a curved edge.

15. A device comprising:
a Micro-Electro-Mechanical System (MEMS) structure comprising:
first openings; and
a movable element in the first openings, wherein the movable element is configured to move in the first openings; and
a carrier substrate bonded to the MEMS structure, wherein the carrier substrate comprises:
a surface facing the MEMS structure; and
a second opening extending from the surface of the carrier substrate to stop at an intermediate level of the carrier substrate, wherein the first openings and the second opening are interconnected to form a continuous opening, wherein the second opening comprises an entry portion and an inner portion wider than the entry portion, and wherein the entry portion is closer to the surface of the carrier substrate than the inner portion.

16. The device of claim 15, wherein the entry portion comprises sidewalls substantially perpendicular to the surface of the carrier substrate.

17. The device of claim 15, wherein the inner portion comprises rounded sidewalls.

18. The device of claim 15, wherein the carrier substrate is free from Complementary Metal-Oxide-Semiconductor (CMOS) devices thereon.

19. The device of claim 15 further comprises a CMOS structure bonded to the MEMS structure, wherein the CMOS structure and the carrier substrate are on opposite sides of the MEMS structure, and wherein the CMOS structure comprises:
a semiconductor substrate; and
CMOS devices at a surface of the semiconductor substrate.

20. The device of claim 15 further comprising an oxide layer between, and in contact with, the MEMS structure and the carrier substrate, wherein the oxide layer comprises a third opening therein, with the third opening connected to the first openings and the second opening to form the continuous opening.

* * * * *

UNITED STATES PATENT AND TRADEMARK OFFICE
CERTIFICATE OF CORRECTION

PATENT NO. : 8,729,646 B2
APPLICATION NO. : 13/571258
DATED : May 20, 2014
INVENTOR(S) : Chia-Hua Chu et al.

It is certified that error appears in the above-identified patent and that said Letters Patent is hereby corrected as shown below:

In the Claims:

In Col. 8, line 64, claim 4, delete the "," after "wherein the CMOS".

Signed and Sealed this
Twelfth Day of August, 2014

Michelle K. Lee
*Deputy Director of the United States Patent and Trademark Office*